US009335348B2

(12) United States Patent
Fong et al.

(10) Patent No.: US 9,335,348 B2
(45) Date of Patent: May 10, 2016

(54) MODULAR HIGH VOLTAGE SENSING UNIT (71) Applicant: Thomas & Betts International, Inc., Wilmington, DE (US)

(72) Inventors: Robert Fong, Bethlehem, PA (US); Daniel L. Gardner, Stewartsville, NJ (US); William Ayala, III, Hackettstown, NJ (US)

(73) Assignee: Thomas & Betts International, Inc., Wilmington, DE (US)

( * ) Notice: Subject to any disclaimer, the term of this patent is extended or adjusted under 35 U.S.C. 154(b) by 265 days.

(21) Appl. No.: 14/036,752

(22) Filed: Sep. 25, 2013

(65) Prior Publication Data
US 2014/0125320 A1 May 8, 2014

Related U.S. Application Data (60) Provisional application No. 61/721,549, filed on Nov. 2, 2012.

(51) Int. Cl.
*G01R 1/20* (2006.01)
*G01R 15/14* (2006.01)
*H02M 1/00* (2006.01)
*G01R 1/00* (2006.01)
*G01R 15/04* (2006.01)

(52) U.S. Cl.
CPC ............... *G01R 1/203* (2013.01); *G01R 15/14* (2013.01); *G01R 1/00* (2013.01); *G01R 15/04* (2013.01); *H02M 1/00* (2013.01); *H04B 2201/00* (2013.01)

(58) Field of Classification Search
CPC .............. H02M 1/00; G01R 1/00; H02J 1/00; H04B 1/00; H04B 2201/00
See application file for complete search history.

(56) References Cited

U.S. PATENT DOCUMENTS

| 4,241,373 A | | 12/1980 | Mara et al. | |
| 4,546,305 A | * | 10/1985 | Goddijn | H02H 11/007 323/299 |
| 4,808,910 A | | 2/1989 | Kessi | |
| RE32,901 E | * | 4/1989 | Nilssen | H05B 41/2856 315/225 |
| 4,823,022 A | | 4/1989 | Lindsey | |
| 5,091,616 A | | 2/1992 | Ramos et al. | |
| 5,103,111 A | | 4/1992 | Tobin et al. | |
| 5,313,106 A | | 5/1994 | Swanson | |
| 5,397,946 A | * | 3/1995 | Truong | G11C 16/225 327/74 |
| 5,585,611 A | | 12/1996 | Harvey et al. | |

(Continued)

FOREIGN PATENT DOCUMENTS

EP 0980528 B1 10/2001

*Primary Examiner* — Huy Q Phan
*Assistant Examiner* — Temilade Rhodes-Vivour
(74) *Attorney, Agent, or Firm* — Snyder, Clark, Lesch & Chung, LLP (57) ABSTRACT A high voltage sensing unit includes a housing having an internal bore. A resistive voltage divider, including a primary resistor and a secondary resistor configured in series, is included within the housing. A connecting assembly is configured to attach the high voltage sensing unit to a terminal of a high voltage switching device. The connecting assembly provides an electrical connection from the high voltage switching device to the primary resistor and physically supports the high voltage sensing unit. An interface cable provides an electrical connection from the secondary resistor to a receptacle on the high voltage switching device, which can receive a voltage signal and pass the voltage signal to a controller using existing control wiring.

18 Claims, 7 Drawing Sheets

(56) References Cited

U.S. PATENT DOCUMENTS

| | | | |
|---|---|---|---|
| 5,698,831 A * | 12/1997 | Abdelgawad et al. | 218/138 |
| 5,729,888 A | 3/1998 | Abdelgawad et al. | |
| 6,362,445 B1 | 3/2002 | Marchand et al. | |
| 6,529,013 B2 * | 3/2003 | Skendzic et al. | 324/628 |
| 6,538,422 B2 | 3/2003 | Potter et al. | |
| 6,677,743 B1 | 1/2004 | Coolidge et al. | |
| 6,717,395 B2 | 4/2004 | Skendzic et al. | |
| 7,133,271 B2 | 11/2006 | Jonas et al. | |
| 7,473,863 B2 | 1/2009 | Schreiber et al. | |
| 7,854,058 B2 | 12/2010 | Schreiber et al. | |
| 7,910,852 B2 | 3/2011 | Chen et al. | |
| 8,163,574 B2 | 4/2012 | Juds et al. | |
| 2007/0257625 A1 * | 11/2007 | Brison | 315/291 |

* cited by examiner

MODULAR HIGH VOLTAGE SENSING UNIT

CROSS-REFERENCE TO RELATED APPLICATION

This application claims priority under 35 U.S.C. §119, based on U.S. Provisional Patent Application No. 61/721,549 filed Nov. 2, 2012, the disclosure of which is hereby incorporated by reference herein.

BACKGROUND OF THE INVENTION

The present invention relates to the field of high voltage electrical equipment. Field upgrades of high voltage equipment can be a difficult and time-consuming task. Modular components may simplify the task of performing field upgrades for high voltage equipment, such as overhead reclosers.

DETAILED DESCRIPTION OF THE PREFERRED EMBODIMENTS

The following detailed description refers to the accompanying drawings. The same reference numbers in different drawings may identify the same or similar elements.

Systems and/or methods described herein are related to voltage sensing unit that is mounted on high voltage equipment, such as a recloser, to measure source-side voltage. In one implementation, the voltage sensing unit may include a housing having a horizontal portion and a vertical portion joined at an elbow. A resistive voltage divider, including a primary resistor and a secondary resistor configured in series, may be included within the housing. A connecting assembly may be configured to attach the high voltage sensing unit to a terminal of a high voltage switching device. The connecting assembly can provide an electrical connection from the high voltage switching device to the primary resistor and can support the high voltage sensing unit (e.g., without the need of additional support brackets). An interface cable may provide an electrical connection from the secondary resistor to a receptacle on the high voltage switching device.

Figure 1:
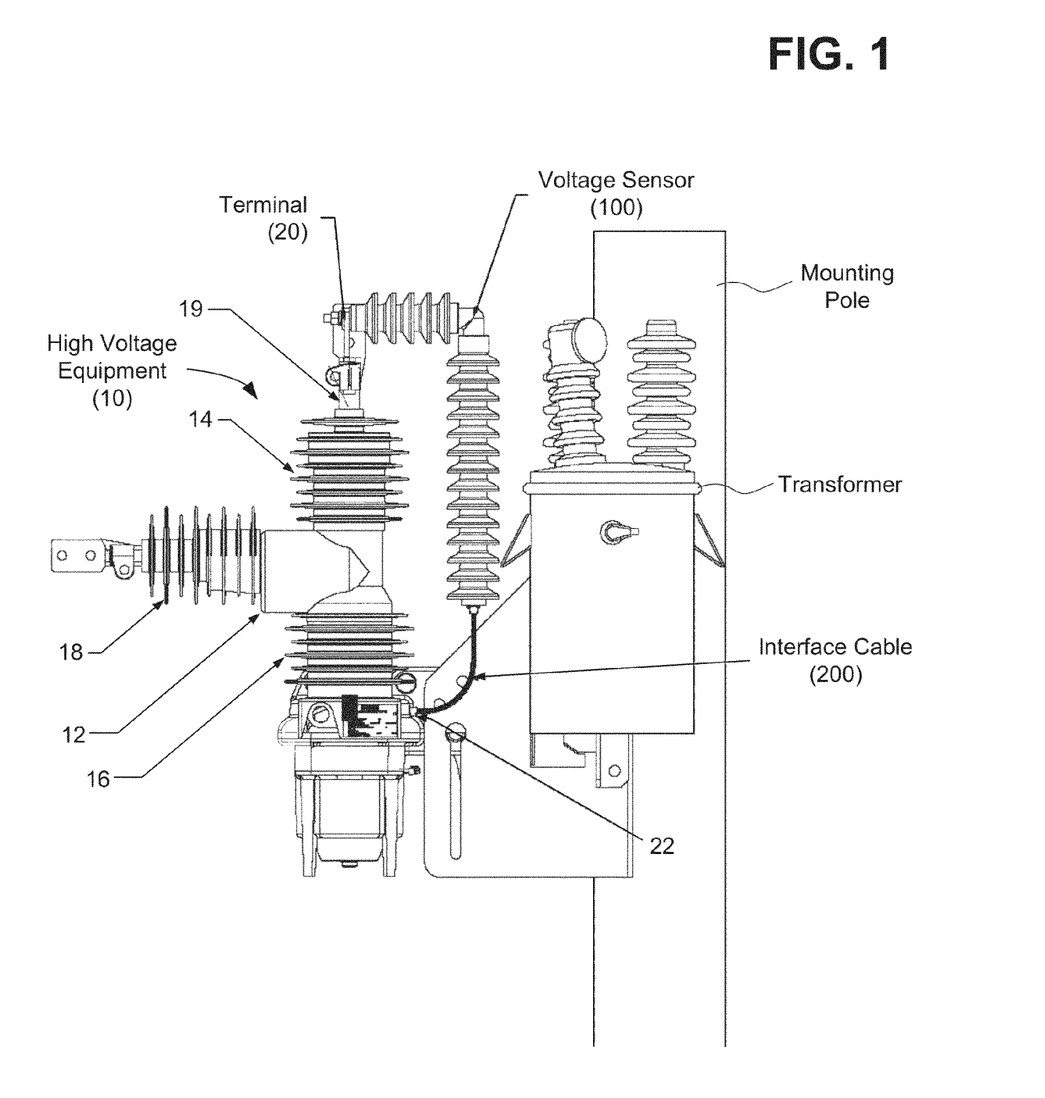
FIG. 1 is a diagram of an exemplary assembly in which systems and/or methods described herein may be implemented.

FIG. 1 provides a diagram of exemplary high voltage equipment 10 in which systems and/or methods described herein may be implemented. In one implementation, high voltage equipment 10 may include a recloser assembly. High voltage equipment 10 may generally be viewed as a circuit breaker equipped with a mechanism that can automatically close the circuit breaker after the breaker has been opened due to a fault. Reclosers may be used, for example, on overhead power distribution systems. For example, as shown in FIG. 1, high voltage equipment 10 may be mounted on a pole with a transformer. Since many short-circuits on overhead lines clear themselves (e.g., after a tree branch or animal that caused the short circuit falls away from the lines), a recloser can improve service continuity by automatically restoring power to a line after a momentary fault.

High voltage equipment 10 may include a high voltage switch with insulator sheds to prevent voltage flashover or voltage tracking due to moisture and contamination. As used in this disclosure with reference to the apparatus, the term "high voltage" refers to equipment configured to operate at a nominal system voltage above 3 kilovolts (kV). Thus, the term "high voltage" refers to equipment suitable for use in electric utility service, such as in systems operating at nominal voltages of about 3 kV to about 38 kV, commonly referred to as "distribution" systems, as well as equipment for use in "transmission" systems, operating at nominal voltages above about 38 kV.

High voltage equipment 10 may generally include an insulator housing 12 covered in part by a top shed sleeve 14, a bottom shed sleeve 16, and a side terminal sleeve 18. Insulator housing 12 may provide structural support to internal components that perform high voltage switching functions. Insulator housing 12 may include an insulating material such as an epoxy, ceramic, porcelain, silicone rubber, an EPDM elastomer, etc. As shown in FIG. 1, a contact assembly 19 may extend out of insulator housing 12 to receive a terminal 20 thereon. Terminal 20 may include, for example, a conductive spade pad with a standard National Electrical Manufacturers Association (NEMA) two-hole connection. Terminal 20 (and supporting components) may be configured to support a particular torque load (e.g., up to 60 pounds) for devices attached to terminal 20.

According to implementations described herein, high voltage equipment 10 may be retrofitted with a voltage sensor 100. Voltage sensor 100 may include a high-voltage resistor that is directly connected (e.g., at terminal 20) to a source-side of high voltage equipment 10. The output of the voltage sensor 100 may be connected to a receptacle 22 mounted on high voltage equipment 10.

Generally, voltage sensor 100 may be an optional component that can be selected by a customer to provide voltage measurement and/or protection. Voltage sensor 100 may retrofit to an existing high voltage equipment 10, enabling customers to add voltage sensor 100 to an existing high voltage equipment 10 subsequent to an initial purchase. Currently, heavy and expensive retrofit devices are used that must be mounted on a utility pole adjacent to the high voltage equipment 10 equipment for measuring voltage. Power wires must also be run up the utility pole to supply power to these retrofit devices. In contrast, voltage sensor 100 provides a lightweight, L-shaped mechanism that is attached to a terminal of high voltage equipment 10 on one end and an interface cable 200 on the other end. Interface cable 200 may plug directly into receptacle 22 on high voltage equipment 10.

Figure 2A:
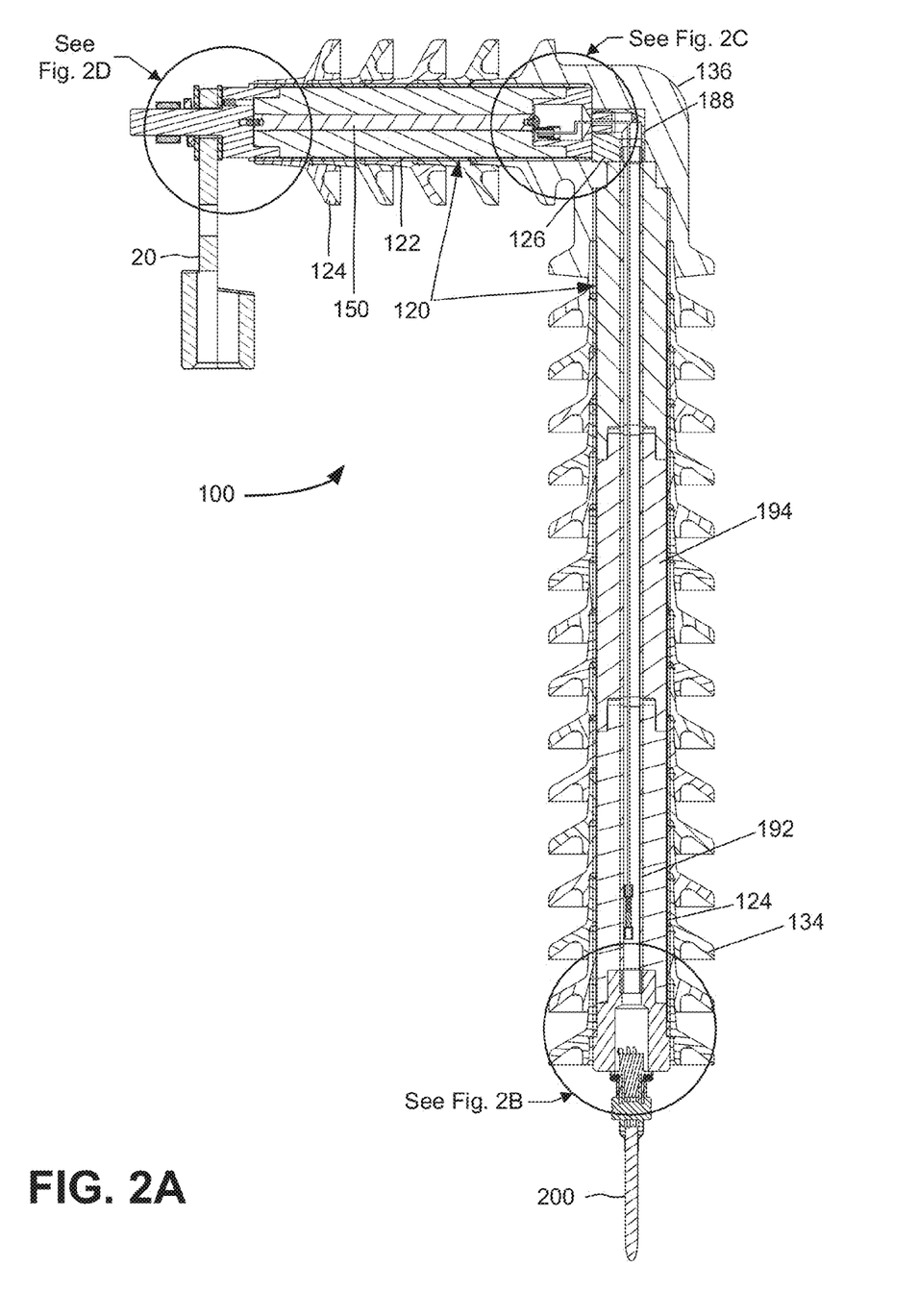
FIG. 2A is a cross-sectional side view of the modular high voltage sensing unit of FIG. 1.
Figure 2B:
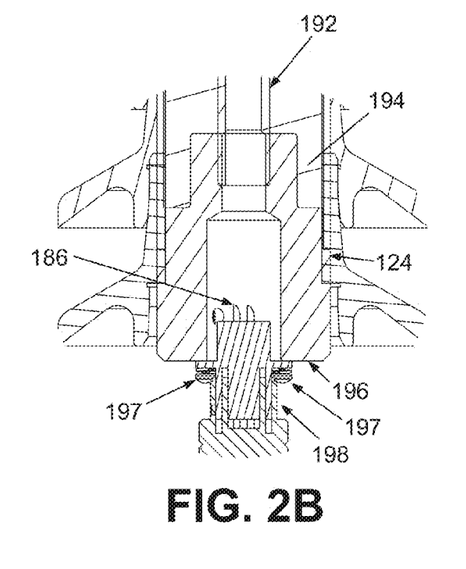
FIGS. 2B-2D are enlarged views of portions of the modular high voltage sensing unit of FIG. 2A.
Figure 2C:
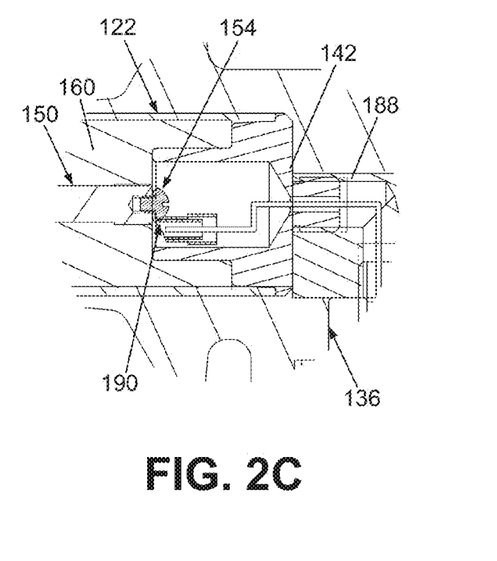
Figure 2D:
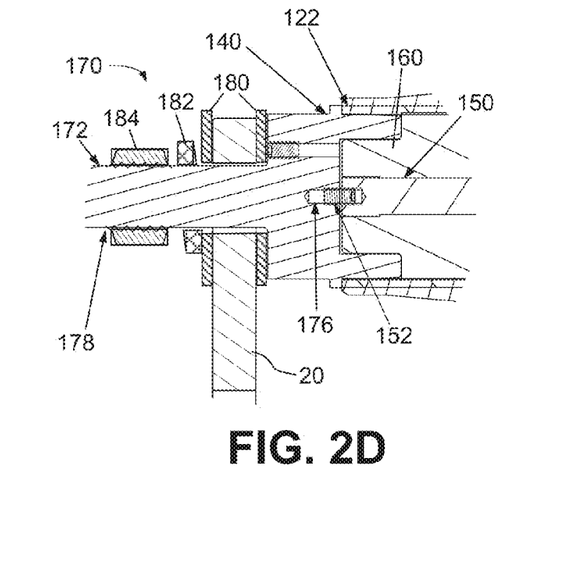
Figure 3:
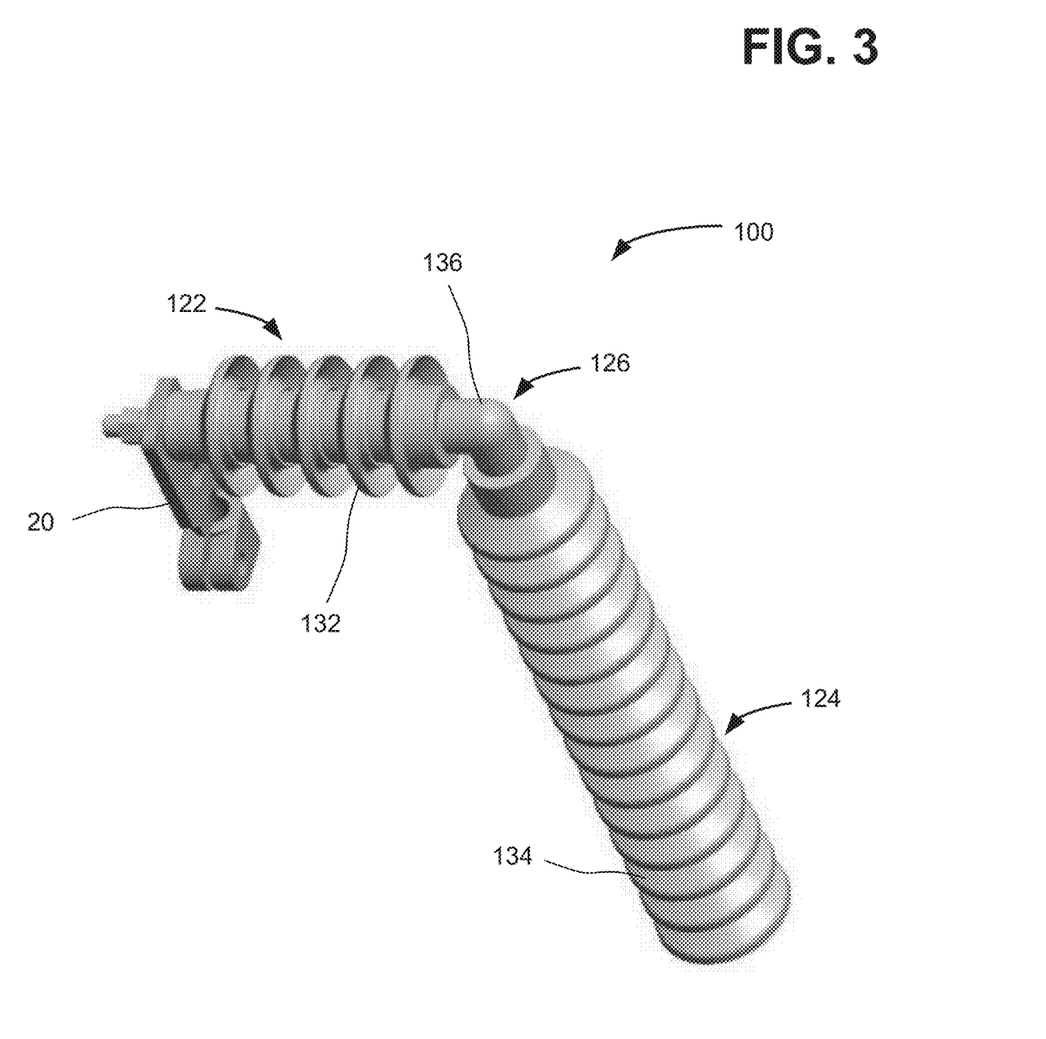
FIG. 3 is an isometric view of the modular high voltage sensing unit of FIG. 1.

FIG. 2A is a side cross-sectional view of an exemplary voltage sensor 100. FIG. 2B is an enlarged view of a bottom portion of the cross-sectional view of FIG. 2A. FIG. 2C is an enlarged view of the interface between a horizontal housing portion and an elbow connector of the cross-sectional view of FIG. 2A. FIG. 2D is an enlarged view of a connecting assembly of the cross-sectional view of FIG. 2A. FIG. 3 provides an isometric view of voltage sensor 100.

As shown in FIGS. 2A-2D, voltage sensor 100 may include an insulated housing 120 to secure internal components. Housing 120 may generally include a tubular configuration with a 90-degree bend to receive voltage sensing components of voltage sensor 100. Housing 120 may include a horizontal housing portion 122 with a horizontal shed sleeve 132, a vertical housing portion 124 with a vertical shed sleeve 134, and an elbow portion 126 with an insulated cover 136.

Housing 120 may generally form an elongated bore extending axially through horizontal housing portion 122, bending though elbow portion 126, and extending axially through vertical housing portion 124 to receive internal components of voltage sensor 100. Internal components, described below, may include, among other components a primary resistor 150 and secondary resistor 186 joined in series to form a resistive voltage divider. Housing 120 may provide a structure to support the internal components. Housing 120 may include an insulating material such as fiberglass, epoxy, ceramic, porcelain, silicone rubber, an ethylene-propylene-diene-monomer (EPDM) elastomer, a thermoplastic polymer, a thermosetting polymer, or a high strength polymer.

As described further herein, horizontal housing portion 122 and vertical housing portion 124 may include a fitting 140 (FIG. 2D) and a fitting 142 (FIG. 2C), at their respective distal ends to secure internal components and to permit electrical connections to internal components. Fitting 140 and fitting 142 may include, for example, threaded pipe fittings and/or flanges to engage respective portions of horizontal housing portion 122 and vertical housing portion 124. Horizontal housing portion 122 and vertical housing portion 124 may be joined to elbow portion 126 using, for example, threaded connections extending from internal components of horizontal housing portion 122 and vertical housing portion 124.

Internal components of voltage sensor 100 may be inserted within the internal bore of horizontal housing portion 122, vertical housing portion 124, and/or elbow portion 126. As shown in FIGS. 2C and 2D, internal components within horizontal housing portion 122 may include a primary resistor 150, and threaded fasteners 152 and 154. Primary resistor 150 may include threaded bores at each end to receive fasteners 152 and 154. In one implementation, primary resistor 150 may be selected to meet requirements of high impedance values combined with very high voltage requirements. For example, primary resistor 150 may include an "SGP 124" resistor. An insulating spacer 160 may be used so as to provide a substantially void-free interface between the inside bore of housing portion 122 and primary resistor 150. For example, insulating spacer 160 may include a low-viscosity, liquid polymer compound injected to fill any voids within the internal bore of horizontal housing portion 122. The same or similar insulating spacer material may be used in vertical housing portion 124.

As shown in FIGS. 2A and 2D, a connecting assembly 170 may extend out of a distal end of horizontal housing portion 122 to receive terminal 20 of high voltage equipment 10. Connecting assembly 170 may include fitting 140 to secure to housing 120 (e.g., horizontal housing portion 122). Fitting 140 may include a shaft 172 that is generally sized to pass through a mounting hole in terminal 20. In one implementation, shaft 172 may include an internal bore 176 and external threads 178 (partially shown in FIG. 2D). Internal bore 176 may be sized to receive a stem of fastener 152. Fastener 152 extend axially from one of the threaded bores of primary resistor 150 and may be inserted into internal bore 176 such that fastener 152 engage fitting 140. When installed as shown in FIGS. 2A and 2D, fastener 152 may permit an electrical connection between fitting 140/shaft 172 and primary resistor 150.

The configuration of connecting assembly 170 in FIGS. 2A-2D is provided as an example. Other configurations may be used to provide an electrical connection between shaft 172 and primary resistor 150. For example, in another implementation (not shown), shaft 172 may include a second axial bore at the distal end of shaft 172 to create a hollow shaft 172. The second axial bore may have a larger diameter than internal bore 176 and may connect to internal bore 176 to form a shoulder. The second axial bore may be sized to receive a fastener therethrough so that a head of the fastener may engage the shoulder. Thus (e.g., instead of fastener 152), the fastener may be inserted through the second axial bore and threaded into internal bore 176 to secure primary resistor 150 to fitting 140, so as to permit an electrical connection between shaft 172 and resistor 150.

Connecting assembly 170 may also include washers 180 to slide over shaft 172 and engage either side of terminal 20. A lock washer 182 and a fastening nut 184, engaging external threads 178, of shaft 172 may be tightened to secure shaft 172 and washers 180 to terminal 20. Connecting assembly 170 may permit mounting of voltage sensor 100 directly to high voltage equipment 10 without the need for additional brackets or other support structures. In some embodiments, shaft 172 may include a sufficient length to accommodate a second terminal pad (not shown) adjacent to terminal 20. Thus, connecting assembly 140 may effectively serve as a fastener to connect terminal 20 to the second terminal pad (e.g., a terminal associated with another device) while also supporting/connecting voltage sensor 100.

As shown in FIGS. 2A, 2B, and 2C, an internal path inside voltage sensor 100 from the end of primary resistor 150 (e.g., at fastener 154) to secondary resistor 186 may be shielded with ground. Particularly, fitting 142 may include, for example, an aluminum fitting that extends from the interface with elbow portion 126 into horizontal housing portion 122 as far as the head of fastener 154. Fitting 142 may be threadedly connected to a threaded elbow tube 188, as shown in FIG. 2C. Threaded elbow tube 188 may include, for example, an aluminum pipe section with a 90-degree bend. A terminal ring 190 may be inserted over the stem of fastener 154 to provide a connecting point for conductive leads/wires between primary resistor 150 and secondary resistor 186. Threaded elbow tube 188 may be enclosed by cover 136, as shown in FIG. 2A. Cover 136 may include material to provide a dielectric barrier around exposed outer surfaces of threaded elbow tube 188. In one implementation, cover 136 may include the same material used for horizontal shed sleeve 132 and vertical shed sleeve 134 (described further below). In other implementations, cover 136 may include a different dielectric material than used for horizontal shed sleeve 132 and vertical shed sleeve 134.

As shown in FIGS. 2A and 2B, vertical housing portion 124 may include rigid pipe 192 extending axially through vertical housing portion 124. Another insulating spacer 194 may be used so as to provide a substantially void-free interface between the inside bore of housing portion 124 and pipe 192. Pipe 192 may include threaded ends to enable attachment to threaded elbow tube 188 and an internal bore to permit connection of leads/wires from primary resistor 150 (e.g., via elbow portion 126) to secondary resistor 186. At a distal end of vertical housing portion 124, pipe 192 may be in threaded engagement with a pipe flange 196. Pipe flange 196 may also be secured to housing 120 (e.g., vertical housing portion 124) via a threaded connection or bonding.

An electrical connector 198 may be secured to pipe flange 196 via fasteners 197. Electrical connector 198 may be electrically coupled to secondary resistor 186, which is connected in series with primary resistor 150 (e.g., via either conductive wires (not shown) or aluminum elbow tube 188). Electrical connector 198 may include, for example, a circular receptacle with a high voltage rating (e.g., 600 V). Electrical connector 198 may connect to interface cable 200, as shown in FIG. 1, to pass an output voltage to receptacle 22. Secondary resistor 186 may be sized for calibration of voltage sensor 100 in conjunction with a controller for high voltage equipment 10. Thus, output voltage ($V_{out}$) from voltage sensor 100 may be measured from interface cable 200. In one implementation, the output voltage may be measured as the product of the input voltage ($V_{in}$) from terminal 20 multiplied by the resistance of secondary resistor 186 ($R_A$) and divided by the sum of $R_A$ and the resistance of primary resistor 150 ($R_B$). Thus, $V_{out}=(V_{in}*R_A)/(R_A+R_B)$.

In one implementation, horizontal shed sleeve 132 and vertical shed sleeve 134 may include a flexible sleeve that is separate from their respective portions of housing 120. Horizontal shed sleeve 132 and vertical shed sleeve 134 may be removably secured over the respective portions of housing 120 using, for example, an interference fit. Horizontal shed sleeve 132, vertical shed sleeve 134, and cover 136 may be made from, for example, a dielectric silicone, elastomer or rubber, which is vulcanized under heat and pressure, such as EPDM elastomer. In some implementations, voltage sensor 100 may include a combination of removable shed sleeves and integrated (e.g., rigid) shed sleeves. For example, in one implementation, horizontal shed sleeve 132 and vertical shed sleeve 134 may be included as removable components, while cover 136 may be provided in an integrated (e.g., bonded) configuration. In other implementations, horizontal shed sleeve 132, vertical shed sleeve 134, and cover 136 may be combined as a single component that may be removably secured over housing 120.

As shown in FIGS. 2A and 3, in some implementations, horizontal shed sleeve 132 and vertical shed sleeve 134 may each include a number of radially extending fins 138 for establishing a creep distance on an exterior of housing 120. Fins 138 may be desirable in above-ground or weather-exposed switch installations, such as overhead switches or reclosers. Increased creep distance may be provided, for example, by changing the spacing and/or dimensions of fins 138 on horizontal shed sleeve 132 and/or vertical shed sleeve 134.

Figure 4:
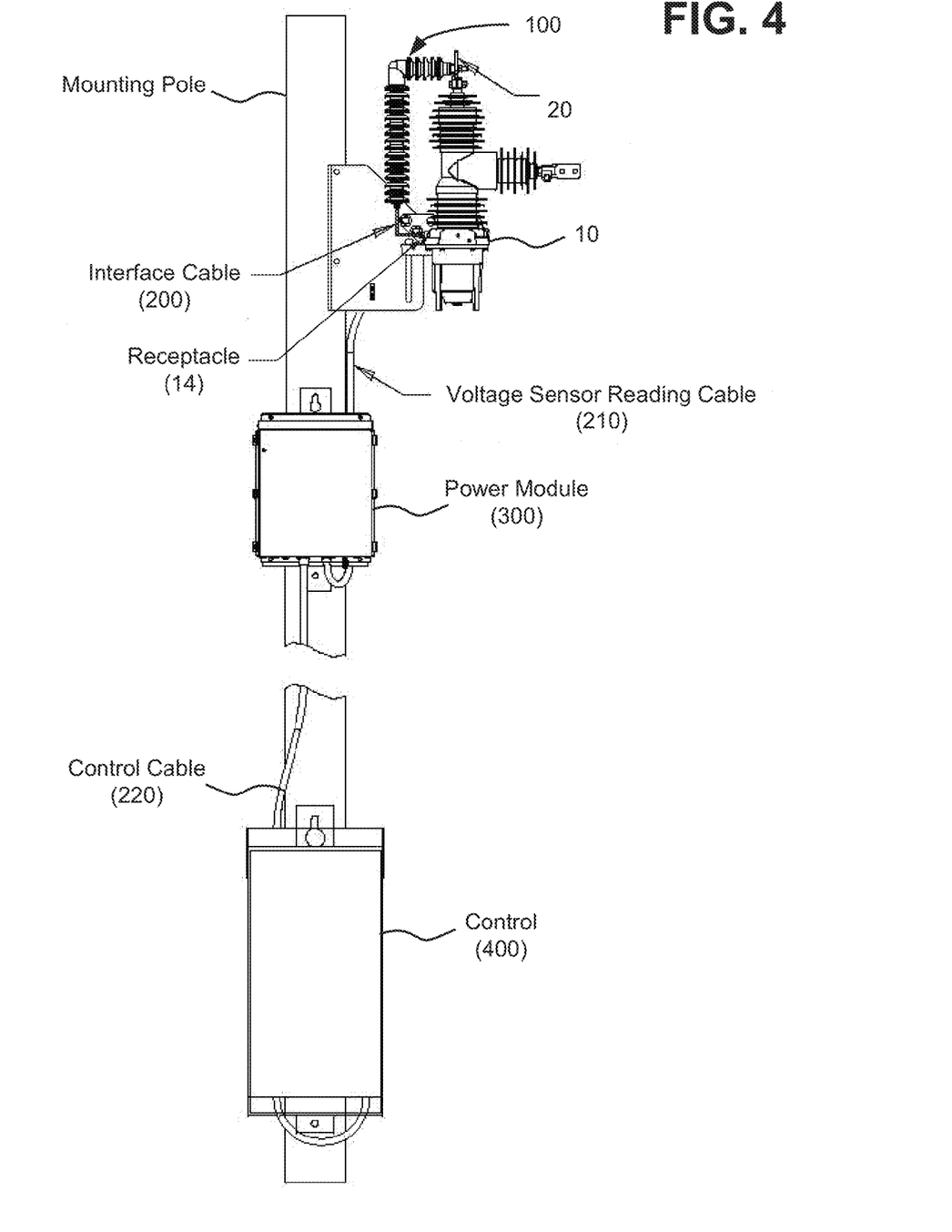
FIG. 4 is a side view of mounted high voltage equipment with the modular high voltage sensing unit of FIG. 1, according to an implementation described herein.
Figure 5:
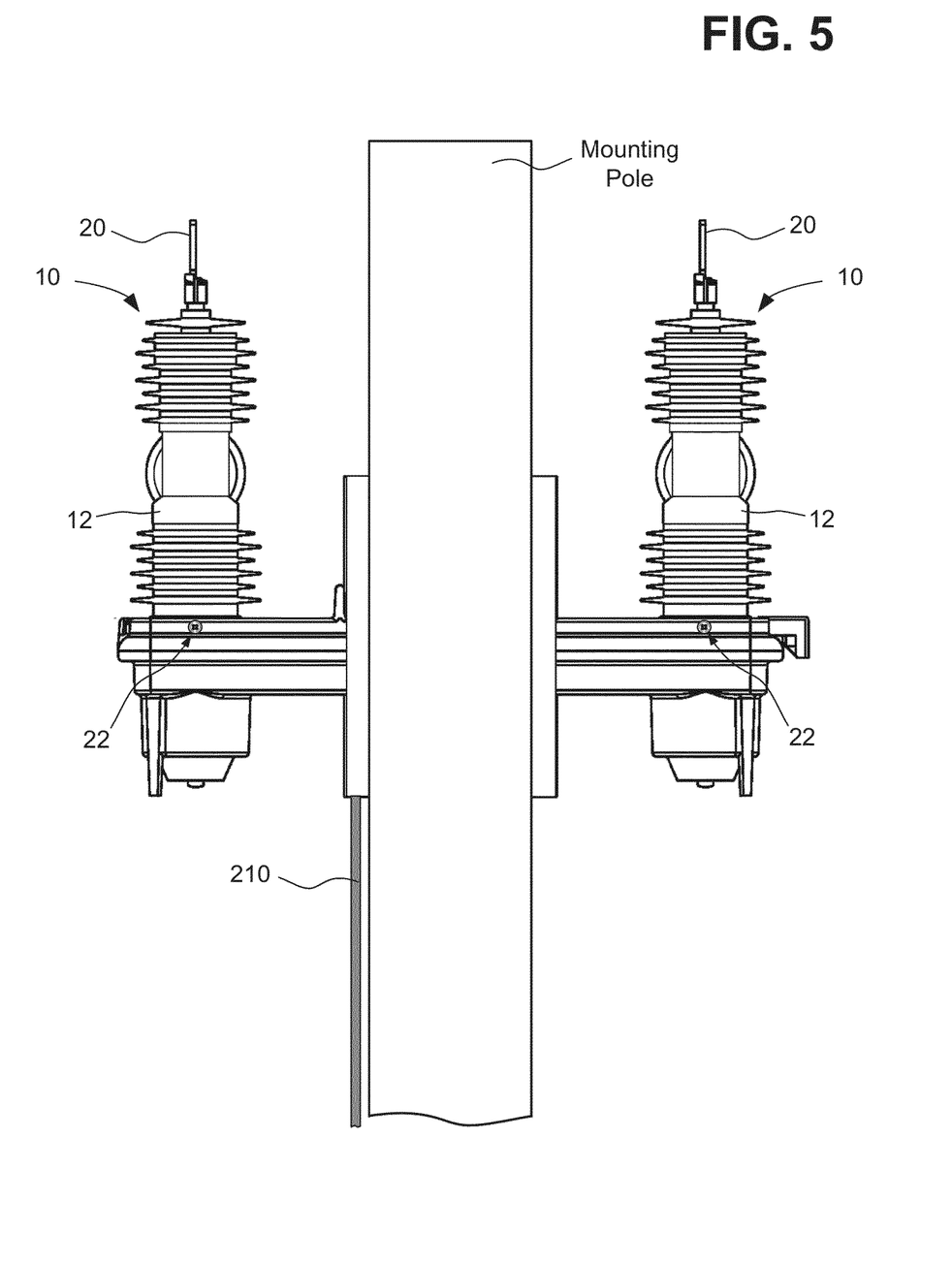
FIG. 5 is a rear view of mounted high voltage equipment to which the modular high voltage sensing unit of FIG. 1 may be installed.

FIG. 4 is a side view of exemplary mounted high voltage equipment 10 with high voltage sensing unit 100, according to an implementation described herein. FIG. 5 is a rear view of exemplary mounted high voltage equipment 10 shown without voltage sensor 100 for clarity. Referring to FIG. 4, high voltage equipment 10 may be mounted on a pole and voltage sensor 100 may be mounted to high voltage equipment 10. Although a single piece of high voltage equipment 10 with mounted voltage sensor 100 is visible in FIG. 4, in another implementation two, three, or more pole-mounted devices 10 may be used. One end of voltage sensor 100 (e.g., connecting assembly 140) may be attached directly onto a top terminal pad (e.g., terminal 20) of high voltage equipment 10. Interface cable 200 may extend from the other end of voltage sensor 100 and plug into receptacle 22 on high voltage equipment 10. A voltage sensor reading cable 210 may extend from high voltage equipment 10 to a power module 300. A single control cable 220 may extend from power module 300 down the mounting pole to a device control unit 400.

High voltage equipment 10 may be preconfigured to receive interface cable 200 and relay voltage signals from voltage sensor 100 to control unit 400 (e.g., via cable 210, cable 220, and power module 300). Interface cable 200 may include, for example, a shielded cable, such as a high voltage coaxial shielded cable, terminated with a connector to interface with receptacle 22. The interface cable 200/receptacle 22 interface may include, for example, F-type connectors, quarter turn connectors, locking connectors, quick-connect BNC (Bayonet Neill-Concelman) connectors, or another suitable outdoor connector. As shown in FIG. 5, high voltage equipment 10 may include receptacle 22 on a rear panel to receive interface cable 200 and to require a relatively short run for interface cable 200.

Voltage sensor 100 may be pre-calibrated for use with control unit 400. Thus, voltage sensor 100 may be installed and ready to use with only attachment of voltage sensor 100 (e.g., connecting assembly 140) to terminal 20 of high voltage equipment 10 and attachment of interface cable 200 to receptacle 22. Because both primary resistor 150 and secondary resistor 186 are included within voltage sensor 100, an accurate voltage sensing signal can be communicated from high voltage equipment 10 to control unit 400 without the need for additional cables from high voltage equipment 10 to power module 300 or control unit 400. That is, the voltage sensing signal can be sent from voltage equipment 10 using existing control wiring, such as control cable 220, or common cables already provided for other purposes.

Figure 6:
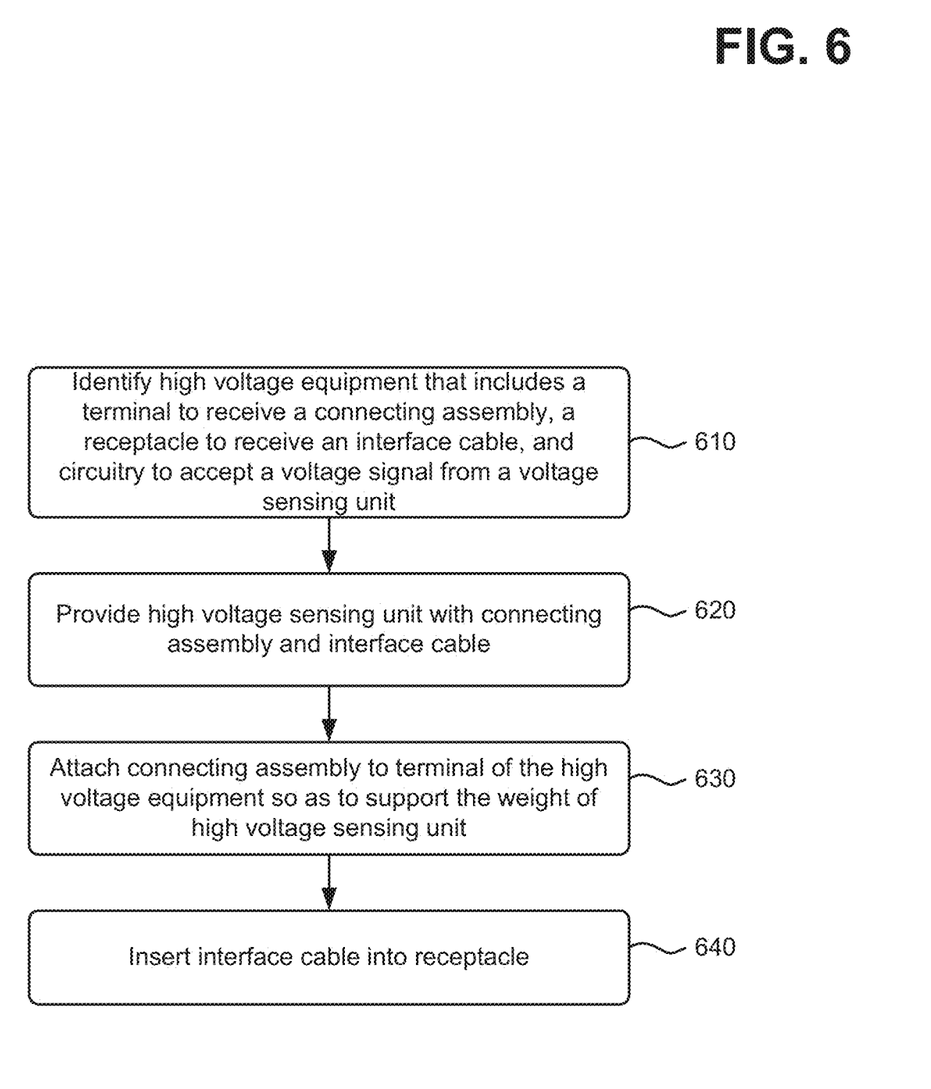
FIG. 6 is a flow diagram of a process for installing the modular high voltage sensing unit of FIG. 1, according to an implementation described herein.

FIG. 6 is a flow diagram of an exemplary process for adding a voltage sensing unit to a high voltage switching device according to an implementation described herein. As shown in FIG. 6, process 600 may include identifying a high voltage equipment that includes a terminal to receive a connecting assembly, a receptacle to receive an interface cable, and circuitry to accept a voltage signal from a voltage sensing unit (block 610); and providing a high voltage sensing unit with the connecting assembly and interface cable (block 620). For example, a technician may identify an installed overhead recloser (e.g., high voltage equipment 10) that is configured to receive modular upgrades, such as high voltage sensing unit 100.

Process 600 may also include attaching the connecting assembly to the terminal of the high voltage switching device so as to support the weight of the high voltage sensing unit (block 630), and inserting the interface cable into the receptacle (block 640). For example, after disconnecting a power source or applying appropriate safety measures, a technician may attach connecting assembly 170 to terminal 20 of high voltage equipment 10. The technician may also connect interface cable 200 between receptacle 22 of high voltage equipment 10 and connector 198 of voltage sensing unit 100.

The foregoing description of exemplary implementations provides illustration and description, but is not intended to be exhaustive or to limit the embodiments described herein to the precise form disclosed. Modifications and variations are possible in light of the above teachings or may be acquired from practice of the embodiments. For example, implementations described herein may also be used in conjunction with other devices, such as low, medium, or high voltage switchgear equipment, including 0-3 kV, 15 kV, 25 kV, 35 kV or higher equipment. For example, various features have been mainly described above with respect to high voltage switches in both overhead and underground switchgear environments. In other implementations, other medium/high voltage power components may be configured to include the modular high voltage sensing unit described above.

Although the invention has been described in detail above, it is expressly understood that it will be apparent to persons skilled in the relevant art that the invention may be modified without departing from the spirit of the invention. Various changes of form, design, or arrangement may be made to the invention without departing from the spirit and scope of the invention. Therefore, the above-mentioned description is to be considered exemplary, rather than limiting, and the true scope of the invention is that defined in the following claims.

No element, act, or instruction used in the description of the present application should be construed as critical or essential to the invention unless explicitly described as such. Also, as used herein, the article "a" is intended to include one or more items. Further, the phrase "based on" is intended to mean "based, at least in part, on" unless explicitly stated otherwise.

What is claimed is:

1. A high voltage sensing unit, comprising:
a housing including a horizontal portion and a vertical portion joined at an elbow, and an internal bore;
a resistive voltage divider including a primary resistor and a secondary resistor configured in series mounted in the housing;
a connecting assembly configured to attach the high voltage sensing unit to a terminal of a high voltage switching device, wherein the connecting assembly provides an electrical connection from the high voltage switching device to the primary resistor, and wherein the connecting assembly supports the high voltage sensing unit; and
an interface cable providing an electrical connection from the secondary resistor to a receptacle on the high voltage switching device,
wherein the horizontal portion supports the primary resistor within an insulating spacer,
wherein the vertical portion supports a grounded shaft, within another insulating spacer, that leads to the secondary resistor,
wherein the horizontal portion includes a horizontal shed sleeve with a plurality of fins extending radially from an exterior surface of the horizontal shed sleeve,
wherein the vertical portion includes a vertical shed sleeve with another plurality of fins extending radially from an exterior surface of the vertical shed sleeve,
wherein the horizontal shed sleeve is removably attached to the outside surface of the horizontal portion via an interference fit, and
wherein the vertical shed sleeve is removably attached to the outside surface of the vertical portion via an interference fit.

2. The high voltage sensing unit of claim 1, wherein the connecting assembly includes a shaft sized to be inserted through a bolt hole of the terminal.

3. The high voltage sensing unit of claim 2, wherein the primary resistor is secured to the connecting assembly via a threaded fastener inserted into a portion of the shaft.

4. The high voltage sensing unit of claim 1, wherein the connecting assembly is configured to support the high voltage sensing unit, when secured to the terminal, without the use of additional support brackets.

5. The high voltage sensing unit of claim 4, wherein the terminal includes a National Electrical Manufacturers Association (NEMA) standard configuration.

6. The high voltage sensing unit of claim 1, wherein the horizontal shed sleeve and the vertical shed sleeve each comprises an ethylene-propylene-diene-monomer (EPDM) elastomer, silicone, or a thermoplastic elastomer.

7. The high voltage sensing unit of claim 1, wherein the horizontal shed sleeve covers at least a portion of the elbow.

8. A system, comprising:
a high voltage sensing unit including:
a resistive voltage divider including a primary resistor and a secondary resistor configured in series,
a connecting assembly configured to attach the high voltage sensing unit to a terminal of a high voltage switching device, wherein the connecting assembly provides an electrical connection from the high voltage switching device to the primary resistor, and wherein the connecting assembly supports the high voltage sensing unit,
an interface cable providing an electrical connection from the secondary resistor to a receptacle on the high voltage switching device,
a horizontal shed sleeve with a plurality of fins extending radially from an exterior surface of the horizontal shed sleeve, and
a vertical shed sleeve with a plurality of fins extending radially from an exterior surface of the vertical shed sleeve,
wherein the horizontal shed sleeve and the vertical shed sleeve each comprises an ethylene-propylene-diene-monomer (EPDM) elastomer, silicone, or a thermoplastic elastomer, and
wherein the horizontal shed sleeve and the vertical shed sleeve are each removably attached to an outside surface of the high voltage sensing unit via an interference fit; and
a high voltage switching device including:
the terminal to receive the connecting assembly,
the receptacle to receive the interface cable, and
circuitry to accept a voltage signal from the voltage sensing unit and forward the voltage signal to a control via a common cable.

9. The system of claim 8, wherein the high voltage sensing unit further includes a generally L-shaped housing to secure the resistive voltage divider.

10. The system of claim 8, wherein the connecting assembly includes a shaft sized to be inserted through a bolt hole of the terminal.

11. The system of claim 10, wherein the primary resistor is secured to the connecting assembly via a threaded fastener inserted into a portion of the shaft.

12. The system of claim 8, wherein the connecting assembly is configured to support the high voltage sensing unit when secured to the terminal.

13. The system of claim 8, wherein the primary resistor is contained within an insulating spacer.

14. A high voltage sensing unit, comprising:
a housing including a horizontal portion, a vertical portion, and an internal bore;
a resistive voltage divider including a primary resistor and a secondary resistor configured in series mounted in the housing;
a connecting assembly configured to attach the high voltage sensing unit to a terminal of a high voltage switching device, wherein the connecting assembly provides an electrical connection from the high voltage switching device to the primary resistor, and wherein the connecting assembly supports the high voltage sensing unit; and
an interface cable providing an electrical connection from the secondary resistor to a receptacle on the high voltage switching device,
wherein the horizontal portion includes a horizontal shed sleeve with a plurality of fins extending radially from an exterior surface of the horizontal shed sleeve, the horizontal shed sleeve being removably attached to the outside surface of the horizontal portion via an interference fit, and wherein the vertical portion includes a vertical shed sleeve with another plurality of fins extending radially from an exterior surface of the vertical shed sleeve, the vertical shed sleeve being removably attached to the outside surface of the vertical portion via an interference fit.

15. The high voltage sensing unit of claim 14, wherein the horizontal portion and the vertical portion are joined at an elbow, and wherein the horizontal shed sleeve extends over at least a portion of the elbow.

16. The high voltage sensing unit of claim 14, wherein the horizontal portion supports the primary resistor within an insulating spacer, and wherein the vertical portion supports a grounded shaft, within another insulating spacer, that leads to the secondary resistor.

17. The high voltage sensing unit of claim 14, wherein the horizontal shed sleeve and the vertical shed sleeve each comprise an ethylene-propylene-diene-monomer (EPDM) elastomer, silicone, or a thermoplastic elastomer.

18. The high voltage sensing unit of claim 14, wherein the connecting assembly is configured to support the high voltage sensing unit, when secured to the terminal, without the use of additional support brackets.

\* \* \* \* \*